(12) United States Patent
Stark et al.

(10) Patent No.: US 7,029,829 B2
(45) Date of Patent: Apr. 18, 2006

(54) LOW TEMPERATURE METHOD FOR FORMING A MICROCAVITY ON A SUBSTRATE AND ARTICLE HAVING SAME

(75) Inventors: Brian H. Stark, Ann Arbor, MI (US); Khalil Najafi, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 268 days.

(21) Appl. No.: 10/417,301

(22) Filed: Apr. 16, 2003

(65) Prior Publication Data

US 2004/0028849 A1 Feb. 12, 2004

Related U.S. Application Data

(60) Provisional application No. 60/373,426, filed on Apr. 18, 2002.

(51) Int. Cl.
*B81C 1/00* (2006.01)

(52) U.S. Cl. ............ 430/320; 430/315; 430/319; 205/122

(58) Field of Classification Search ............ 430/320; 205/118, 122, 135, 157
See application file for complete search history.

(56) References Cited

U.S. PATENT DOCUMENTS

| | | | |
|---|---|---|---|
| 4,853,669 A | | 8/1989 | Guckel et al. |
| 5,354,714 A | * | 10/1994 | Boysel ............ 437/209 |
| 5,576,147 A | | 11/1996 | Guckel et al. |
| 5,963,788 A | | 10/1999 | Barron et al. |
| 5,976,994 A | | 11/1999 | Nguyen et al. |
| 6,169,321 B1 | | 1/2001 | Nguyen et al. |
| 6,232,150 B1 | | 5/2001 | Lin et al. |
| 6,297,072 B1 | | 10/2001 | Tilmans et al. |
| 6,423,241 B1 | * | 7/2002 | Yoon et al. ............ 216/27 |
| 6,436,853 B1 | | 8/2002 | Lin et al. |
| 6,534,850 B1 | | 3/2003 | Liebeskind |
| 2003/0089394 A1 | | 5/2003 | Chang-Chien et al. |

FOREIGN PATENT DOCUMENTS

WO    WO 02/19011    3/2002

OTHER PUBLICATIONS

Guckel H., Surface Micromachined Pressure Transducers, Sensors And Actuators, A 28, pp. 133-146, 1991.

Mastrangelo, C.H., et al., Vacuum-Sealed Silicon Micromachined Incandescent Light Source, IEEE, IEDM, pp. 503-506, 1989.

Lin, Liwei, et al., Microelectromechanical Filters For Signal Processing, Journal of Microelectromechanical Systems, vol. 7, No. 3, pp. 286-294, Sep. 1998.

Lebouitz, Kyle S., et al., Vacuum Encapsulation of Resonant Devices Using Permeable Polysilicon, IEEE MEMS Conference, pp. 470-475, 1999.

Bartek, M., et al., Vacuum Sealing of Microcavities Using Metal Evaporation, Sensors And Actuators A 61, pp. 364-368.

Leung, A.M., et al. Micromachined Accelerometer Based On Convection Heat Transfer, IEEE MEMS Conference, pp. 627-630, 1998.

Sparks, D.R., et al., Flexible Vacuum-Packaging Method For Resonating Micromachines, Sensors And Actuators, A 55, pp. 179-183, 1996.

Khanna, P.K., et al., Analysis of Packaging And Sealing Techniques For Microelectronic Modules And Recent Advances, Microelectronics International, vol. 16, pp. 8-12, 1999.

Stark, Brian H., et al:, An Ultra-Thin Hermetic Package Utilizing Electroplated Gold, Transducers '01, pp. 194-197, Munich, Jun. 2001.

Lin, Liwei, et al., Vacuum-Encapsulated Lateral Microresonators, Int. Conf. On Solid-State Sensors And Actuators, Transducers '93, pp. 270-273, Yokohama, Japan, Jun. 1993.

(Continued)

*Primary Examiner*—John A. McPherson
(74) *Attorney, Agent, or Firm*—Brooks Kushman P.C.

(57) ABSTRACT

A low temperature method for forming a microcavity on a substrate and article having same are provided which utilize electroplated films. The method is particularly useful to package microelectromechanical systems (MEMS) in vacuum on the wafer level and provide sealed feedthroughs to the outside world. The method may be performed in a batch process to substantially reduce cost and to form metal diaphragms. Furthermore, the method is performed at near room temperature, which provides more flexibility in the manufacturing process. The method enables substantial cost savings in the production of vacuum-sealed MEMS. Many feedthroughs can be incorporated into the package to transfer signals in and out of the package. One significant advantage of this method is that it does not require bonding of a second substrate, which reduces the system cost.

20 Claims, 5 Drawing Sheets

OTHER PUBLICATIONS

Kageyama, Yasuyuki, et al., Resonating Microstructures In Microshells With HF Permeable Polycrystalline Silicon And Vacuum Sealing Thin Films, Digest, The 10$^{th}$ IEEE Int. Conf. On Solid-State Sensors And Actuators, Transducers '01, pp. 340-343, Sendai, Japan, Jun. 1999.

Lund, Jennifre L., et al., A Low Temperature Bi-CMOS Compatible Process For MEMS RF Resonators And Filters, Technical Digest, Solid-State Sensor, Actuator And Microsystems Workshop, pp. 38-41, Hilton Head Island, South Carolina, Jun. 2-6, 2002.

Core, Theresa A., et al., Fabrication Technology For An Integrated Surface-Micromachined Sensor, Solid State Technology, pp. 39-47, 1993.

Stokes, K., et al., Polyether Polyurethanes For Implantable Pacemaker Leads, Biomaterials, vol. 3, pp. 225-231, 1982.

Loeb, Gerald E., et al., Parylene As A Chronically Stable, Reproducible Microelectrode Insulator, IEEE Trans. Biomed. Eng., vol. BME-24, pp. 121-128, Mar. 1977.

Enikov, Eniko T., et al., Electroplated Electro-Fluidic Interconnects For Chemical Sensors, Sensors and Actuators 84, 2000, pp. 161-164.

Chang-Chien, Patty P.L., et al., Wafer-Level Packaging Using Localized Mass Deposition, Eurosensors XV, The 11$^{th}$ International Conference on Solid-State Sensors And Actuators, Munich, Germany, Jun. 10-14, 2001, pp. 182-185.

Cheng, Y.T., et al., Localized Bonding With PSG Or Indium Solder As Intermediate Layer, Proceedings of IEEE International Conference on Micro Electro Mechanical Systems, Orlando, 1999, pp. 285-289.

Cheng, Y.T., et al., Fabrication And Hermeticity Testing Of A Glass-Silicon Package Formed Using Localized Aluminum/Silicon-To-Glass Bonidng, International MEMS Conference, 2000, pp. 757-762.

Lin, Liwei, MEMS Post-Packaging By Localized Heating And Bonding, IEEE Transactions On Advanced Packaging, vol. 23, No. 4, Nov. 2000, pp. 608-616.

Wang, Yuelin, et al., The Structures For Electrostatic Servo Capacitive Vacuum Sensors, Sensors And Actuators, A66, 1998, pp. 213-217.

Guckel, H., et al., Planar Processed Polysilicon Sealed Cavities For Pressure Transducer Arrays, IEEE International Electron Devices Meeting, Technical Digest, IEDM '84, pp. 223-225, San Francisco, 1984.

Yu-Ting, Cheng, Localized Heating And Bonding Technique For MEMS Packaging, Ph.D Dissertation, University of Michigan, 2000.

Henmi, H., et al., Vacuum Packaging For Microsensors By Glass-Silicon Anodic Bonding, International Conference On Solid State Sensors And Actuators, Transducers 93, pp. 584-587, 1993.

* cited by examiner

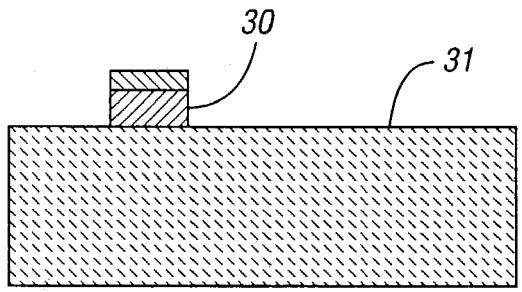
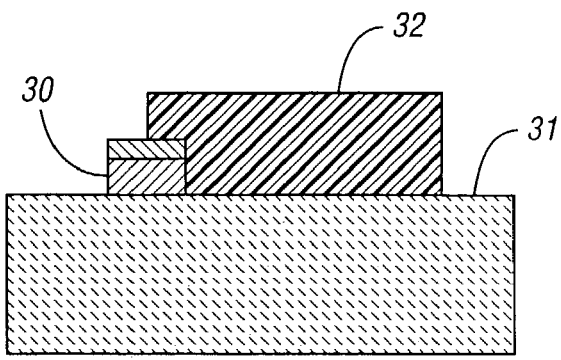
Fig. 3a
Fig. 3b
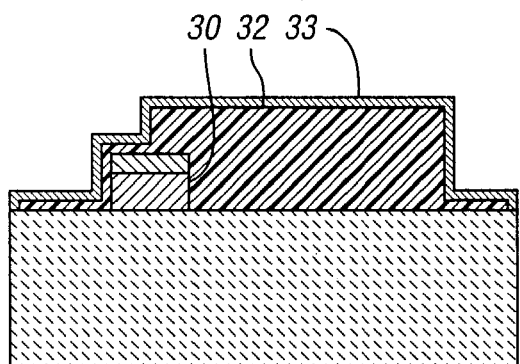
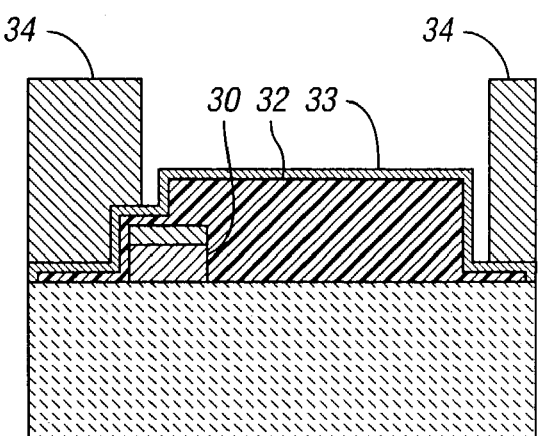
Fig. 3c
Fig. 3d
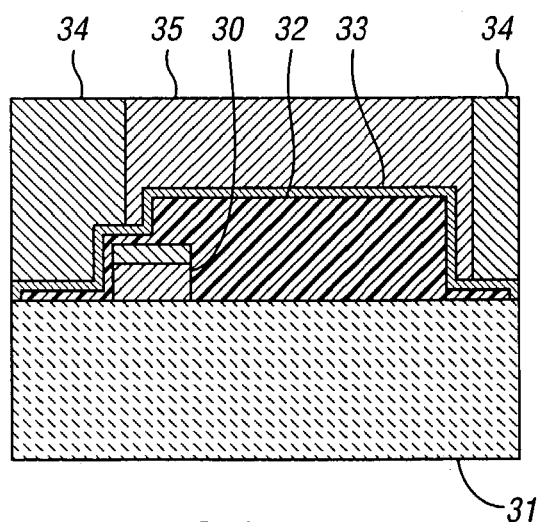
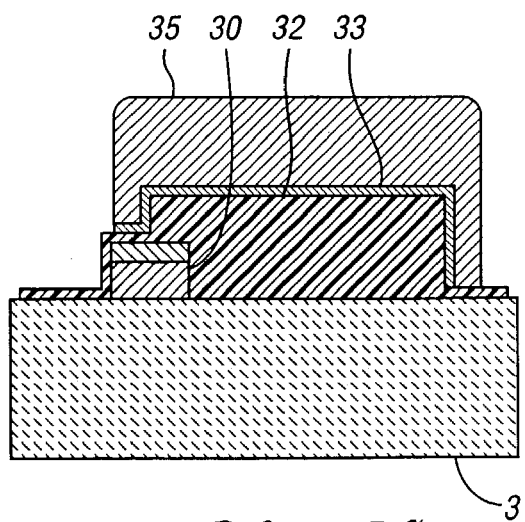
Fig. 3e
Fig. 3f

LOW TEMPERATURE METHOD FOR FORMING A MICROCAVITY ON A SUBSTRATE AND ARTICLE HAVING SAME

CROSS-REFERENCE TO RELATED APPLICATION

This application claims the benefit of U.S. provisional application Ser. No. 60/373,426, filed Apr. 18, 2002 and entitled "A Vacuum Encapsulation Technique Utilizing Electroplated Films," which is hereby incorporated in its entirety by reference herein.

STATEMENT REGARDING FEDERALLY SPONSORED RESEARCH OR DEVELOPMENT

This invention was made with Government support under Contract No. EEC-9986866 awarded by NSF-ERC. The Government has certain rights to the invention.

BACKGROUND OF THE INVENTION

1. Field of the Invention

This invention relates to low temperature methods for forming microcavities on a substrate and articles having same.

2. Background Art

Micromachined sensors, actuators, microinstruments, and microsystem have made significant progress during the past two decades and many prototype devices have been demonstrated for a number of different applications. Many other devices have been successfully commercialized, including pressure sensors for automotive and industrial processing applications, and more recently accelerometers for automotive and consumer applications. Other devices are also finding their way into large volume commercial markets, such as MEMS for optical communication systems (sometimes referred to as micro-opto-electro-mechanical-systems or MOEMS), MEMS for wireless RF communication systems (RF MEMS), and the increasingly growing area of biomedical microsystems (BioMEMS). Other emerging applications include micro power generation systems, environmental monitoring systems, microsystems for industrial process control, health care, and consumer applications. While these application require a variety of different sensors, actuators, low-power interface and signal processing circuits, and wireless interfaces, they all share the need for reliable, stable, and low-power packaging technologies. Packaging has been one of the most costly and least developed aspects of a microsystem, and often plays a detrimental effect on overall device performance. Much of the packaging technologies developed for commercialized devices has relied on adapting already existing technologies previously developed for integrated circuits. These technologies have been useful in some MEMS devices, including accelerometers, which require relatively simple techniques. The main shortcoming of many of these technologies is the fact that they are applied to individual devices, typically at the end of the fabrication process after the devices are diced apart from their host wafer. This requires individual handling of the final device in order to incorporate the package into its final intended package. This individual handling increases the chances of damage to the device, has a negative influence on device performance, and, most importantly, increases the cost. Therefore, attention has increasingly been focused on developing new technologies that can be applied at the wafer level, usually before the device is separated from the host wafer.

Because of the diversity of applications, device structures, and requirements for MEMS and microsystems, a variety of packaging and interconnect techniques have to be developed to meet the requirements of these applications.

There are several key technological challenges in packaging of Microsystems. These can be categorized under three general topics of: transducer encapsulation (protection), connection, and assembly as listed in Table 1. Packaging of MEMS is different than packaging of other standard microelectronic components because MEMS by their nature require direct interaction with their surrounding environment. As a result, the device cannot be physically isolated from the surrounding environment and selective access needs to be provided to the sensing/actuating part of the MEMS device. This creates a significant problem for the package, since the package has to protect the device while providing access to the environment the device is supposed to interact with, simultaneously. As a result, a lot of effort has been expended on developing the proper protection/encapsulation medium for MEMS. Two general approaches have been taken: the first depends on a package in the form of a shell or capsule that can be bonded to the device substrate; and the second relies on using a thin film material that protects the regions that need protection, while providing access to those that need to interact with the external environment. In either case, the packaging has to satisfy certain requirements.

TABLE 1

Key Technological Requirements in Packaging and Assembly of Integrated Microsystems

| Encapsulation/Protection | Connection | Assembly |
| --- | --- | --- |
| Shells, Thin Films | Reconfigurable | Modularized |
| Selective Exposure | Electrical/Fluidic/Optical | Removable |
| Wafer-Level, small | Sealed/Buffered Feedthroughs | Standardized |
| Hermetic, or Vacuum-Sealed | Cables, Spring Contacts | Reconfigurable |
| Corrosion Resistant, Media-Compatible | Low Parasitics (R, C, L), Small | Reusable |
| Long-term stability, reliability, uniformity, reproducibility, and long-term testing | | |

The most important requirement is that the package can be applied at the wafer level before the devices are diced apart from their host wafer. This wafer level approach not only reduces cost, but also protects the device during the subsequent process steps, such as cleaning and dicing that often damage the delicate MEMS device. The package needs to be as small as possible, dictated either by the requirement for low-cost or by the application area itself that often requires a small size for proper operation. The package has to provide a hermetically-sealed environment, and, in some instances, a vacuum medium that is stable over many years, such as is required in resonant devices. The package should be resistant to harsh media the MEMS operate in, but it additionally needs to be compatible with the media it operates in and not cause any damage to that media, as, for example, in biomedical applications where the package has to be biocompatible. This last requirement is often overlooked, but frequently has significant implications for the process technologies and materials used since it limits the range of materials and processes that can be used to implement the package.

The second category of techniques that need to be developed for packaging of MEMS and Microsystems is that of connection. As mentioned before, MEMS packages have to be capable of providing access to the environment with which the sensor/actuator interacts. This means that the package has to be capable of providing sealed and reliable feedthroughs between the sensor/actuator, that are typically outside of the package and in direct exposure to the surrounding media, and devices/electronics that are sealed inside the package. In addition, once packaged, the MEMS devices have to have interconnections that transfer signals from the device to the outside world. Interconnects are not only for electrical signals but also for other types of signals such as optical, fluidic, and chemical signals. So, one has to be able to pass a variety of signals to and from the device after it has been packaged. The most suitable interconnection techniques are those that can be easily reconfigured and reused for different applications. It is desirable that interconnects are easily removed and reused as the device is used in different Microsystems. The connection should not degrade the signal quality and have low parasitics (such as resistance, capacitance, or inductance), and it should be as small as possible for obvious reasons. Interconnections and feedthroughs are often ignored when a packaging technology is developed for MEMS, but usually end up being one of the most important aspects of the package because they are either very large, or cause device failure.

The third category of techniques required for packaging of microsystems is that of assembly. This area is also often overlooked but becomes increasingly critical when developing microsystems that combine a number of different chips and modules. One simple example of assembly is when the MEMS chip is to be connected to a circuit chip. This has historically been done by placing both substrates on a common board, often a printed circuit board that has the required traces to transmit signals from one chip to the other. Wire bonding is then used to interconnect pads on the MEMS/IC chip to the traces on the board. In many emerging Microsystems, however, this approach is neither sufficient nor practical. These Microsystems usually contain more than two substrates and they have to occupy a very small volume. Therefore, the assembly and interconnect approaches chosen have to be compatible with small size, and flexibility often required by a given application. In addition, cost is a critical factor and needs to be kept as small as possible. Therefore, it is vital that assembly techniques that are reliable, modular, and reconfigurable be developed. It is advantageous if a set of standards can be developed for a variety of device substrates, so that, independent of the device type, the shape and input/output (IO) pad layout is such that they can all be assembled together using a standard mechanism. Many multi-chip systems are assembled together without any possibility of reconfigurability and re-work. If the assembly technique is re-workable, meaning that after assembly the individual units can be pulled apart and reassembled again without the loss of performance or yield, and if the physical layouts and dimensions are standardized, the overall cost of Microsystems could be significantly reduced. Modularity is another desirable feature of future microsystem assembly technologies. This means that different chips can be assembly together in a modular fashion, so that one can be taken out and replaced with another without the need for developing a whole new set of hardware. Therefore, where possible, assembly structures and interfaces need to be standardized, use techniques that are amenable to re-work and multiple connect/disconnect cycles, be small, and be compatible with a variety of device types and technologies.

In all of these areas, the need for low cost and small packaging technologies that can be integrated with the devices and Microsystems being developed is paramount and often determines whether a given approach is successful or not. In order to satisfy many of these requirements, microfabrication and micromachining technologies, such as those developed for MEMS, have to be used, and seamlessly integrated with the overall fabrication process of the microsystem.

Packaging Using Capsules or Shells

As mentioned above, the package needs to protect the sensitive parts of MEMS while allowing selective access to those parts that need to be in contact with the medium being monitored. One way to provide such protection is based on using a physical shell or capsule that can be placed over the sensitive parts, while feedthroughs are passed through the package to connect to other components that are in contact with the medium, as illustrated in FIG. 1b. The capsule can be fabricated from a variety of materials, including metals, like a metal can or enclosure, glass/ceramic, silicon, or other semiconductor materials. It is often fabricated as an individual or separate piece that is applied to the MEMS part. This individual handling is not desirable because it increases the cost and also exposes the MEMS part to process steps that can potentially damage or compromise the part. It is, therefore, desirable that the package capsule be fabricated at the wafer level before the MEMS parts are diced apart from their host wafer, and that the package wafer is bonded to the device wafer using a reliable technique. Therefore, the area where the package and the device substrate are attached is an important area, and a reliable bonding technique should be utilized to achieve a permanent seal between the package and the substrate. To do this, a variety of bonding techniques have been utilized. These bonding techniques include silicon-glass bonding, glass frit bonding, eutectic or solder bonding, and a variety of other bonding techniques. The advantages of a package capsule is that it can provide a very reliable and long-term stable hermetic or vacuum environment since these packages are quite resistant to permeation by various gases or environmental parameters such as moisture. Another important aspect of the package is the feedthroughs needed to transfer signals from sensors/actuators outside of the package to the devices and circuits inside the package cavity. Lateral (or on wafer) feedthroughs or vertical (or through wafer) feedthroughs may be fabricated. In either case, the feedthrough has to have low parasitics (resistance or capacitance) and has to be an integral part of the overall package and be sealed to avoid any leakage. Feedthroughs are often a primary source of failure in many packages.

Encapsulation and Protection Using Thin-Film Packages:

In addition to using a capsule or shell 8 as illustrated in FIG. 1b for providing a hermetic or vacuum package for MEMS 9, it is increasingly attractive to use a thin film 10 to provide the necessary protection or encapsulation for MEMS 11, as illustrated in FIG. 1a wherein a package seal 12 is also provided. Thin films are attractive because they occupy a very small area, can be formed using a variety of techniques, and are compatible with wafer-level processing. In addition, they can take any shape or form. However, most thin film materials are either not hermetic, or are so thin that they can be compromised easily when exposed to the environmental conditions MEMS typically experience.

Two categories of thin film materials can be identified, organic and inorganic materials. Organic materials include such films as epoxies, silicones, a variety of polymers including polyimides, polyurethanes, Parylene-C, etc. The majority of these films can be deposited at low temperatures, are quite conformal and their characteristics can be modified for different applications. However, most of these films are not hermetic and most are prone to moisture penetration, or can be attacked in harsh environments. In spite of this, these materials still have found widespread use because they can be selectively used in applications which may not require very long-term operation, or where the conditions are controlled, or where the performance specifications are not very tight. In fact, polymers are perhaps the most widely used material of any for packaging, albeit not hermetic or vacuum packaging.

The second category of materials used for packaging and protection is inorganic materials. These materials include films such as silicon nitride, silicon carbide, polycrystalline diamond, metal thin films, tantalum oxide, or thin films of other materials that are resistant to environmental parameters. Semiconductor materials such as silicon or silicon carbide are quite attractive because they can be deposited readily and are resistant to many corrosive environments. The main challenge in using these materials is that they typically require a high temperature to achieve a reasonable deposition rate, and in some instances the films are not quite as conformal as required by some applications. Therefore, they have not been widely used for hermetic packaging, especially where hybrid components are involved. A short review of some of the approaches to hermetic and vacuum packaging based on thin films is described below.

Hermetic Packaging Using Inorganic Films

Silicon nitride has long been used for protection of integrated circuits against moisture. Stoichiometric silicon nitride is especially attractive since it is quite impervious to moisture and other contaminants. It has also been used in MEMS for protection of circuits and sensors against salt water or biological solutions. All tests to date indicate that silicon nitride is an excellent thin film material for hermetic encapsulation even when used in very thin layers. In order to ensure long-term operation and stability, it is critical that the film is deposited to be very dense, and as pinhole-free as possible. Pinholes are usually the points of failure. This requires that the surface on which it is deposited be free of any contaminants and debris. While this is possible in some applications, it is not possible in other applications. The temperature required for deposition of silicon nitride is typically above 400° C. The best quality films are deposited using an LPCVD technique, which is performed at above 800° C. LPCVD films of silicon nitride, in conjunction with silicon dioxide, have been used to encapsulate conductors on a flexible silicon cable and are shown to be stable in salt water, under mechanical and electrical stress, for more than two years.

Thin films of metal are also attractive for hermetic packaging of MEMS. Metals are particularly of interest because they provide an excellent barrier against moisture and other contaminants.

In addition to films such as silicon nitride and metal films, other materials have also been used for hermetic packaging of circuits and MEMS. These include tantalum oxide (TaO), silicon carbide (SiC), and polycrystalline diamond films. All of these films have been demonstrated to be excellent against corrosion and are resistant to moisture penetration. Of these, the latter two can only be deposited at temperatures above 600° C., which limits their application. Tantalum oxide can be sputtered by reactive sputtering from a tantalum source in an oxygen environment. However, the step coverage can be a problem if large steps or hybrid components are used.

Vacuum Packaging Using Inorganic Films

Several techniques to vacuum seal systems utilizing deposited thin films have been developed. One of the first techniques was based on a deposited polysilicon film to seal a resonant pressure sensor in vacuum. In this technique, polysilicon was deposited over a sacrificial layer of silicon dioxide. The sacrificial layer was later etched through etch holes to release the mechanical structure. The etch holes were then sealed by a deposited layer of either LPCVD silicon nitride or polysilicon. This technique was proven to be quite powerful since it provided for a very small package at the wafer level using standard materials.

Other groups used similar techniques to encapsulate other resonant structures such as gyroscopes using either silicon nitride or polysilicon. These techniques are effective, but are very process specific, require high temperatures (>500° C.) and result in relatively thin package shells that have to be mechanically supported. One of the limitations of these approaches is that the package film cannot be deposited to very high thicknesses, and this could eventually compromise the vacuum integrity or the mechanical stability of the package.

The following references are related to this application:
1. U.S. Pat. No. 5,576,147;
2. H. Guckel, "Surface Micromachined Pressure Transducers," SENSORS AND ACTUATORS, A 28, pp. 133–146, 1991;
3. U.S. Pat. No. 4,853,669;
4. C. H. Mastrangelo et al., "Vacuum-Sealed Silicon Micromachined Incandescent Light Source," IEEE, IEDM, pp. 503–506, 1989;
5. L. Lin et al., "Micromechanical Filters for Signal Processing," J. MEMS, col. 7, pp. 286–294, 1998;
6. K. S. Lebouitz et al., "Vacuum Encapsulation of Resonant Devices Using Permeable Polysilicon," IEEE MEMS CONFERENCE, pp. 470–475, 1999;
7. M. Bartek et al., "Vacuum Sealing on Microcavities Using Metal Evaporation," SENSORS AND ACTUATORS, A 61, pp. 364–368;
8. A. M. Leung et al., "Micromachined Accelerometers Based on Convection Heat Transfer," IEEE MEMS CONFERENCE, pp. 627–630, 1998;
9. D. R. Spark et al., "Flexible Vacuum-Packaging Method for Resonating Micromachines," SENSORS AND ACTUATORS, A 55, pp. 179–183, 1996;
10. K. Klanna et al., "Analysis of Packaging and Sealing Techniques for Microelectronic Modules and Recent Advances," MICROELECTRON. INT., Vol. 16, pp. 8–12, 1999;
11. T. A. Core et al., "Fabrication Technology for an Integrated Surface-Micromachined Sensor," SOLID STATE TECHNOLOGY, pp. 39–47, 1993.
12. B. H. Stark et al., "An Ultra-Thin Hermetic Package Utilizing Electroplated Gold," TRANSDUCERS '01, pp. 194–197, Munich, June 2001.
13. K. Stokes et al., "Polyether Polyurethanes for Implantable Pacemaker Leads," BIOMATERIALS, Vol. 3, pp. 225–231, 1982.
14. G. E. Loeb et al., "Parylene-C as a Chronically Stable, Reproducible Microelectrode Insulator," IEEE TRANS. BIOMED. ENG., Vol. BME-24, pp. 121–128, March 1977.

15. L. Lin et al., "Vacuum Encapsulated Lateral Microresonators," INT. CONF. ON SOLID-STATE SENSORS AND ACTUATORS (TRANSDUCERS '93), pp. 270–273, Yokohama, Japan, June 1993.
16. Y. Kageyama et al., "Resonating Microstructures in Microshells with HF Permeable Polycrystalline Silicon and Vacuum Sealing Thin Films," DIGEST, THE 10TH IEEE INT. CONF. ON SOLID-STATE SENSORS AND ACTUATORS (TRANSDUCERS '01), pp. 340–343, Sendai, Japan, June 1999.
17. J. L. Lund et al., "A Low Temperature BI-CMOS Compatible Process for MEMS RF Resonators and Filters," TECHNICAL DIGEST, SOLID-STATE SENSOR, ACTUATOR AND MICROSYSTEMS WORKSHOP, pp. 38–41, Hilton Head Island, S.C., Jun. 2–6, 2002.

SUMMARY OF THE INVENTION

An object of the present invention is to provide an improved low temperature method for forming a microcavity on a substrate and article having same.

In carrying out the above object and other objects of the present invention, a low temperature method for forming a microcavity on a substrate is provided. The method includes forming a sacrificial spacer on a region of the substrate. The method further includes depositing a metal film to a desired thickness over the sacrificial spacer to encapsulate the sacrificial spacer. At least one fluid passageway is formed, communicating the sacrificial spacer with the ambient. The sacrificial spacer is removed through the at least one fluid passageway so that the metal film forms a metal diaphragm which defines a microcavity.

The method may further include sealing the at least one fluid passageway to form a sealed microcavity.

The sacrificial spacer may be a photoresist, and the step of removing may utilize a photoresist etch.

The metal may be nickel.

The step of depositing may include the step of electroplating the metal over the sacrificial spacer.

The at least one fluid passageway may include at least one etch channel.

The step of sealing may be performed in vacuum so that the sealed microcavity is a sealed vacuum microcavity, and the desired thickness of the metal diaphragm may be sufficient to sustain one atmosphere of differential pressure thereacross.

The substrate may be a wafer.

The method may further include forming at least one fluid feedthrough in communication with the sealed microcavity.

The desired thickness may be greater than approximately 20 microns.

The step of sealing may include the step of sputtering a layer of material to seal the microcavity or the step of sealing may include the step of collapsing the at least one fluid passageway.

The step of sealing may include the step of plugging the at least one fluid passageway with solder.

The temperature may not exceed 250° C. during the entire method.

Further in carrying out the above object and other objects of the present invention, an article of manufacture is provided. The article includes a substrate and a metal diaphragm which defines a sealed vacuum microcavity and which has a desired thickness. The article further includes at least one microstructure formed on the substrate and located within the sealed vacuum microcavity.

The substrate may be a wafer.

The at least one microstructure may include at least one MEMS device.

The metal may be nickel.

The desired thickness of the metal diaphragm may be sufficient to sustain one atmosphere of differential pressure thereacross.

The article may further include at least one feedthrough in communication with the at least one microstructure.

The desired thickness may be greater than approximately 20 microns.

The metal diaphragm may be electroplated.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIGS. 3a–3k are side sectional schematic views which show the fabrication process for the metal vacuum package of FIGS. 2a and 2b;

DETAILED DESCRIPTION OF THE PREFERRED EMBODIMENTS

Figure 1A:
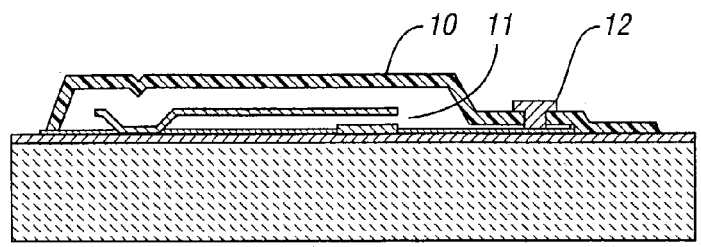
FIG. 1a is a side sectional schematic view illustrating the structure of a MEMS package formed using a thin-film capsule or shell.
Figure 1B:
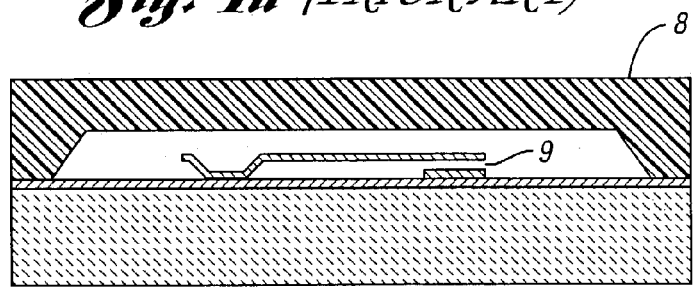
FIG. 1b is a side sectional schematic view illustrating the structure of a MEMS package formed using a hardened package capsule or shell.
Figure 2A:
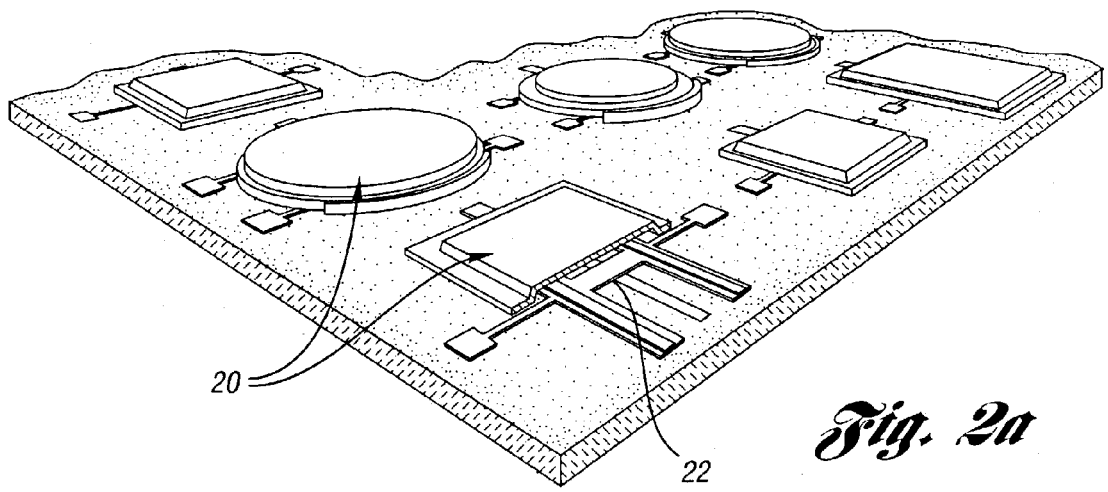
FIG. 2a is a schematic perspective view showing electroplated metal shells used for vacuum packaging of MEMS.

The invention generally provides for packaging of MEMS devices based on electroplated deposited metal films. Metal films have the advantage of low-temperature deposition, large thickness, and excellent resistance to penetration by moisture or other contaminants. These metal packages are schematically and generally illustrated at 20 in FIGS. 2a and 2b for a MEMS device 22. The package can have any shape, has a small footprint, and is formed by electroplating a suitable metal, such as nickel 24, over a sacrificial layer such as photoresist or evaporated glass, which is subsequently removed. Insulators 26 and gold structures 28 are also formed on a substrate 29.

In general, after MEMS fabrication, a layer of thick photoresist is deposited over the entire device region. On top of this photoresist, a plating base of gold is deposited, and a thick layer of nickel is electroplated where the package is to be located. Before this step, feedthroughs for signal transmission, and etch channels for removing the photoresist are also fabricated. After electroplating is completed, the photoresist under the package is removed using a standard photoresist etch, and the etch channels through which the photoresist is removed are sealed off in vacuum. This completes processing.

The attractive feature of this package is that it can be applied at low temperature, can be made arbitrarily thick by plating the metal to the desired thickness, and it can have a deep cavity by using as thick a photoresist as needed for either large MEMS structures or for making the package less sensitive to pressure fluctuation due to outgassing. The process enables batch vacuum sealing at low temperature without the use of wafer bonding, which results in minimal amount of die area used for vacuum sealing. This package could have an arbitrary shape, and can be fabricated in multiple sites on a given die. Since the package is fabricated out of metal, it has the added benefit of shielding the cavity from outside interference.

The package has been tested and shown to hold vacuum and, when it is made to a thickness of more than 20 µm, it is strong enough to sustain the one atmosphere of differential pressure across it.

Figure 2B:
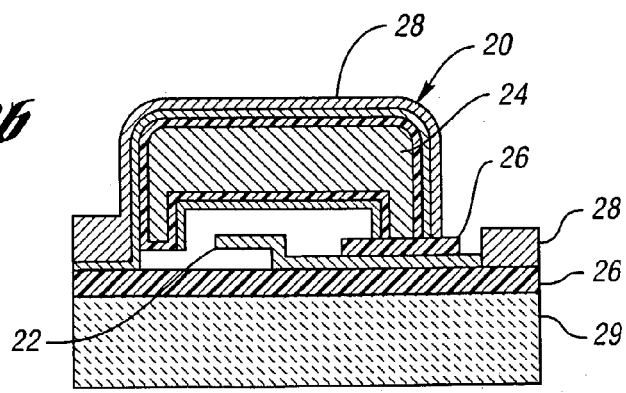
FIG. 2b is a side sectional schematic view of a package with a MEMS device and electrical feedthroughs.
Figure 3G:
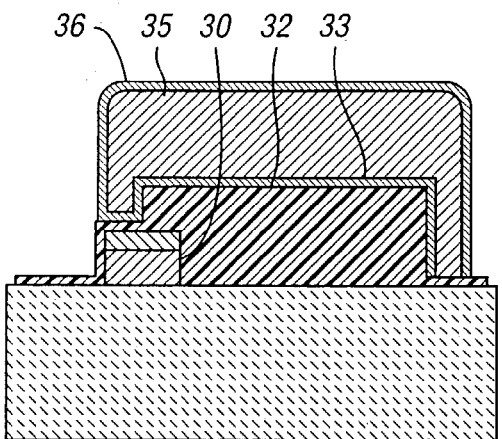
Figure 3H:
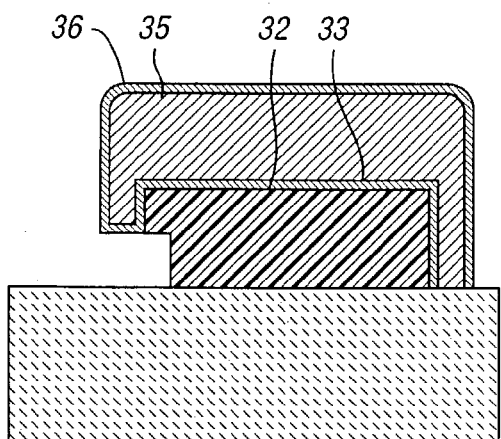
Figure 3I:
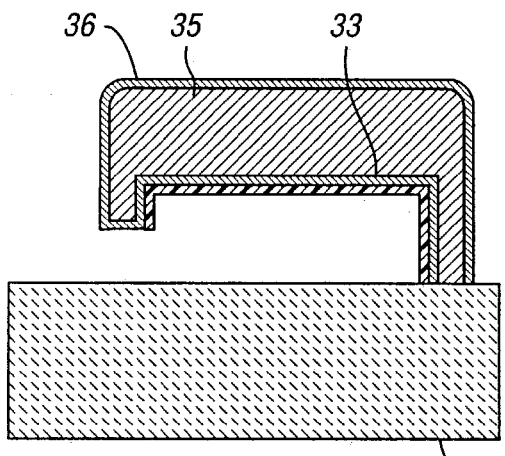
Figure 3J:
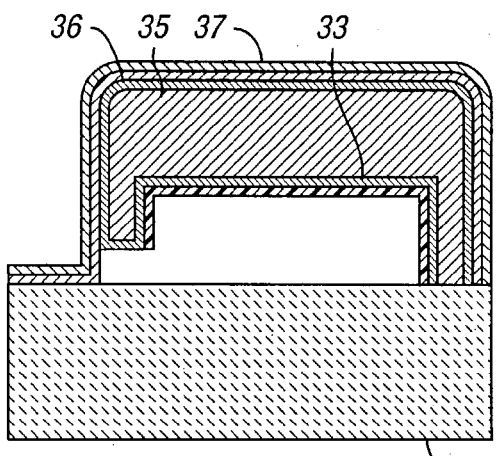
Figure 3K:
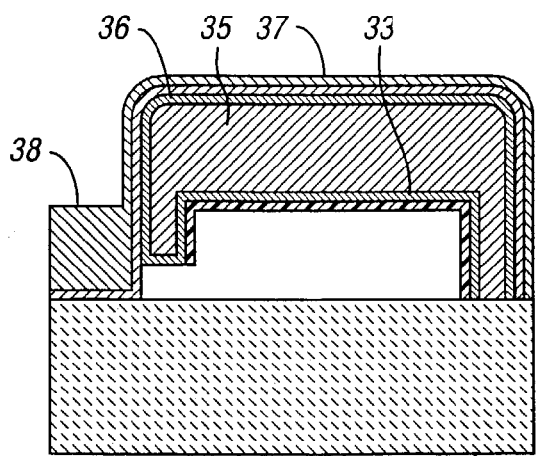

The process for manufacturing this package is shown in FIGS. 3a–3k. More specifically, as shown in FIG. 3a, first a 1500 Å/300 Å Al/Cr feedthrough 30 is deposited on an oxidized silicon wafer 31. Then an 18-micron thick layer of AZ9260 sacrificial photoresist 32 is patterned on top of it, as shown in FIG. 3b. This layer 32 is then extensively baked to reduce future outgassing. After this bake, a 500 Å/5000 Å Cr/Au seed layer 33 is evaporated, as shown in FIG. 3c. Then a 30-micron thick plating mold 34 is defined, as shown in FIG. 3d. Electroplating 35 microns of nickel 35, which takes about 4 hours, follows this, as shown in FIG. 3e. The plating mold 34 is then stripped, as shown in FIG. 3f, followed by the seed layer and the aluminum feedthrough 30 in FIG. 3h after selectively plating a gold layer 36 as shown in FIG. 3g. The AZ9260 photoresist 32 is then removed in FIG. 3i with acetone and the nickel packages are carefully cleaned and dried. This creates the devices, shown in FIGS. 2a and 2b, which are wafer level released Ni cavities. As shown in FIG. 3j, a thick (~2.4 micron Au) layer 37 of Cr/Au is sputtered to vacuum seal the packages. Then, gold 38 is plated as shown in FIG. 3k. Throughout this process, the temperature never exceeds 150° C.

The advantage of creating a package structure such as this is that it can encase a MEMS structure within the vacuum cavity. Some MEMS structures require vacuum-sealed cavities to realize their ultimate performance potential and the manufacture of this cavity has been a significant portion of the cost of the MEMS device. In some instances package costs are an order of magnitude higher than device costs, making the cost effective manufacture of vacuum-sealed cavities important to reducing overall system costs. Another important feature of these package is that they should have feedthroughs to the outside world. This method of the invention allows one to manufacture feedthroughs underneath the package without much added process complexity. Feedthroughs are implemented simply by adding a dielectric layer over the top of a conductor running underneath the package. FIG. 2b shows the cross section of a MEMS device, with feedthroughs.

Figure 4:
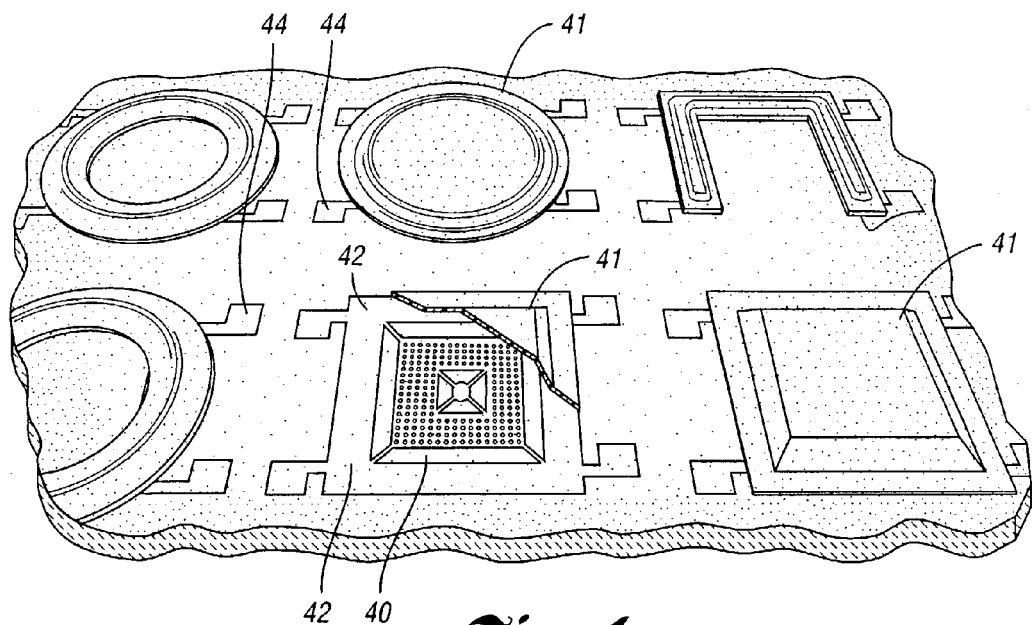
FIG. 4 is a schematic perspective view, partially broken away to show a micro Pirani gauge, packaged in accordance with a second embodiment of the present invention.

A second embodiment of the invention enables batch vacuum sealing at low temperature (<250° C.) without the use of wafer bonding, which results in minimal amount of die area used for vacuum sealing. Furthermore, by implementing large fluidic feedthroughs, the package can be cleaned in a relatively short time (~3 hours) compared to previous work. This package could have an arbitrary shape, and can be fabricated in multiple sites on a given die as shown in FIG. 4. An integrated Pirani gauge is implemented in this process to characterize the hermetiticity of the package. Release is performed after the construction of the 1$^{st}$ level package, which reduces the potential for handling damage.

In the above-described first embodiment, packages were fabricated from electroplated nickel, in which vacuum sealing was demonstrated by sputtering a thick gold film (2.4 µm) over a thin gap (~1500 Å) fluidic feedthrough. The package of the second embodiment differs in that it represents a simplified process flow (3 masking steps instead of 6) with substantially lower fluidic resistance feedthroughs and shows integration with MEMS components as well as leak data from several sealing technologies.

The process for manufacturing the packages 41 of FIG. 4 with an integrated Pirani gauge 40 is shown in FIGS. 5a–5i.

Figure 5A:
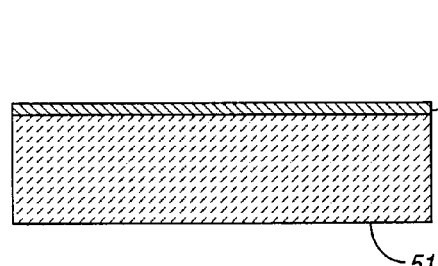
FIGS. 5a–5i are side sectional schematic views which show the fabrication process for the metal vacuum package of FIG. 4.

Initially, a layer 50 of thermal oxide, $SiO_2$, is grown on a silicon substrate 51 in FIG. 5a.

Figure 5B:
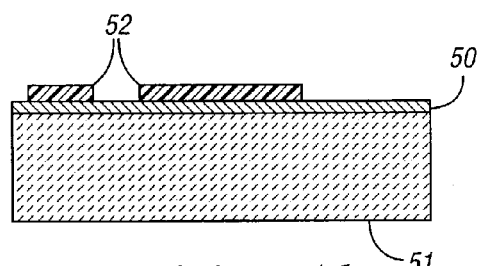
Figure 5C:
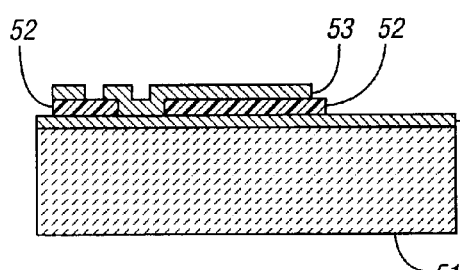

Then, a layer 52 of polysilicon is grown and patterned in FIG. 5b. Then, a layer of dielectric 53, $SiO_2/Si_3N_4$, is grown and patterned in FIG. 5c.

Figure 5D:
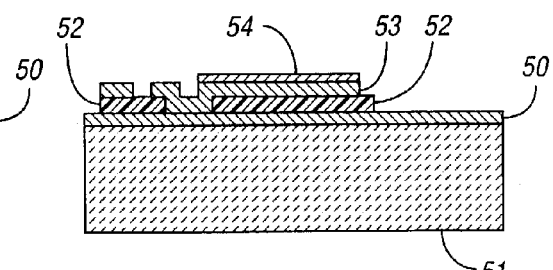

As shown in FIG. 5d, a layer 54 of Cr/Pt is provided (i.e., lift off).

Figure 5E:
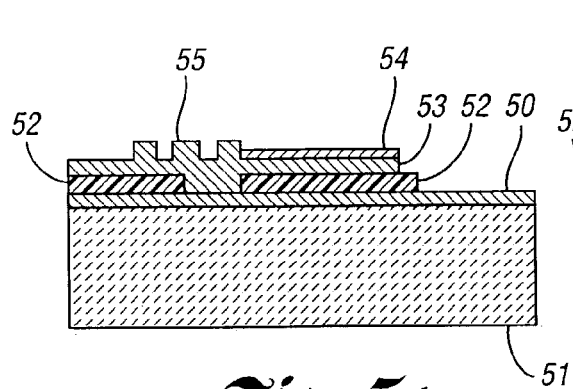

As shown in FIG. 5e, a layer 55 of Cr/Au is provided (i.e., lift off).

Figure 5F:
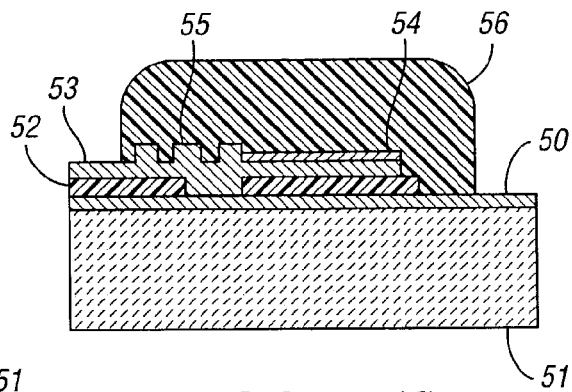

As shown in FIG. 5f, a photoresist 56 is spun.

Figure 5G:
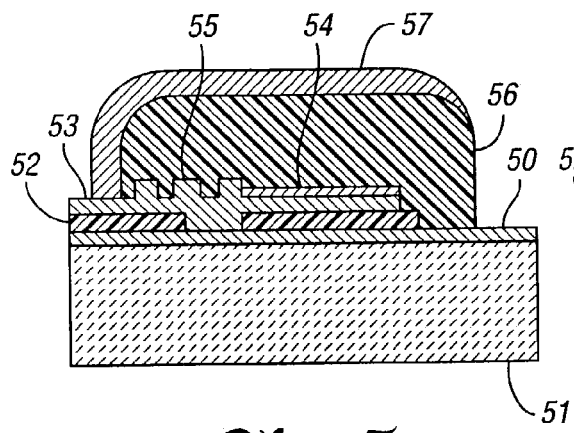

As shown in FIG. 5g, nickel metal 57 is electroplated.

Figure 5H:
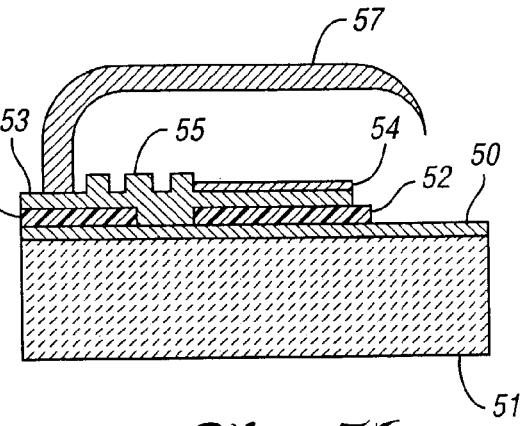

As shown in FIG. 5h, the photoresist 56 is removed to release the structures.

Figure 5I:
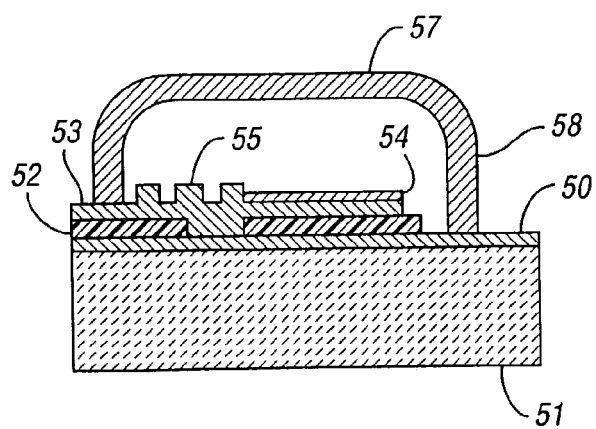

As shown in FIG. 5i, the device is vacuum-sealed at 58 such as by a metal layer or solder plug as described hereinbelow.

Referring again to FIG. 4, the Pirani gauge 40 is defined in a 4-mask surface micromachined process that employs polysilicon both as a sacrificial material and for package feedthroughs 42. Pads 44 are also provided as shown in FIG. 4.

Referring again to FIGS. 5a–5i, this is followed by deposition of the 8-micron thick sacrificial photoresist spacer 56 that also defines a fluidic access port. This structure is then capped in the 40-micron thick electroplated nickel 57. The photoresist and sacrificial polysilicon layer are then simultaneously etched in TMAH and dried in supercritical $Co_2$. The polysilicon etch in the 800×800 µm package takes three hours as compared to 35 minutes for unpackaged devices. The cleaning process is limited by etching the polysilicon, which dissolves at a rate of 0.75 µm/min inside the package, as compared to an etch rate of 1 µm/min in unpackaged devices. Conformal covering of the feedthroughs occurs without the need for planarization. By increasing the vertical height of the fluidic access port from a few thousand Angstroms to 6–8 microns, the effective fluidic resistance into the package is dropped by at least 3 orders of magnitude.

Sealing this structure required process development. Two approaches were considered. The first approach consists of closing the feedthrough by means of collapsing it to the substrate with a localized welding process and the other approach attempts sealing by filling the gap with a material deposited into the port. Both techniques are described below.

Localized Welding

The first attempts to seal the packages centered on locally melting or collapsing the fluidic feedthrough. Several methods were considered. Use of a laser to melt the feedthrough was first attempted. A high power laser (600 µJ 9 ns pulses) was focused on the feedthrough and used to locally heat the joint past the melting point. A variety of energies and pulse repetitions were attempted to optimize the heating process. Following this, localized resistance welding was investigated. Two tungsten tips were brought into contact with the package and an electrical pulse was applied across the package in order to melt it. Finally, ultrasonic crimping was studied by using a wire bonder wedge to apply ultrasonic pulses to the feedthrough. The ultrasonic wedge would then crimp the feedthrough to the substrate.

Solder Bumping

An alternative method to sealing the fluidic feedthrough utilized Pb/Sn solder balls to encapsulate the package. Previous groups have shown that it is possible to vacuum seal MEMS using solder in a wafer bonding technique. This work indicated the minimum achievable pressure level was related to the exposed solder surface, which is likely related to the amount of flux residue present in the package. Compared to wafer bonded packages, this thin film package will have a low exposed cross section of solder and should be capable of reaching lower vacuum levels than previously reported. After fabrication and release of the Pirani gauge, a 63n/37Pb solder paste was stenciled over the package by means of a custom stainless steel micro stencil. The package was then inserted into a vacuum chamber and heated past the soldering temperature (~230° C.). The resultant structure consists of a MEMS structure inside a cavity that is encased in solder.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A low temperature method for forming a microcavity on a substrate, the method comprising:
   forming a sacrificial spacer on a region of the substrate;
   depositing a metal film to a desired thickness over the sacrificial spacer to encapsulate the sacrificial spacer;
   forming at least one fluid passageway communicating the sacrificial spacer with the ambient;
   removing the sacrificial spacer through the at least one fluid passageway so that the metal film forms a metal diaphragm which defines a microcavity; and
   sealing the at least one fluid passageway to form a sealed microcavity, wherein the step of sealing includes the step of collapsing the at least one fluid passageway.

2. The method as claimed in claim 1, wherein the sacrificial spacer is a photoresist and wherein the step of removing utilizes a photoresist etch.

3. The method as claimed in claim 1, wherein the metal is nickel.

4. The method as claimed in claim 1, wherein the step of depositing includes the step of electroplating the metal over the sacrificial spacer.

5. The method as claimed in claim 1, wherein the at least one fluid passageway includes at least one etch channel.

6. The method as claimed in claim 1, wherein the step of sealing is performed in vacuum so that the sealed microcavity is a sealed vacuum microcavity and wherein the desired thickness of the metal diaphragm is sufficient to sustain one atmosphere of differential pressure thereacross.

7. The method as claimed in claim 1, wherein the substrate is a wafer.

8. The method as claimed in claim 1, further comprising forming at least one fluid feedthrough in communication with the sealed microcavity.

9. The method as claimed in claim 1, wherein the desired thickness is greater than approximately 20 microns.

10. The method as claimed in claim 1 wherein temperature does not exceed 250° C. during the entire method.

11. A low temperature method for forming a microcavity on a substrate, the method comprising:
    forming a sacrificial spacer on a region of the substrate;
    depositing a metal film to a desired thickness over the sacrificial spacer to encapsulate the sacrificial spacer;
    forming at least one fluid passageway communicating the sacrificial spacer with the ambient;
    removing the sacrificial spacer through the at least one fluid passageway so that the metal film forms a metal diaphragm which defines a microcavity; and
    sealing the at least one fluid passageway to form a sealed microcavity, wherein the step of sealing includes the step of plugging the at least one fluid passageway with solder.

12. The method as claimed in claim 11, wherein the sacrificial spacer is a photoresist and wherein the step of removing utilizes a photoresist etch.

13. The method as claimed in claim 11, wherein the metal is nickel.

14. The method as claimed in claim 11, wherein the step of depositing includes the step of electroplating the metal over the sacrificial spacer.

15. The method as claimed in claim 11, wherein the at least one fluid passageway includes at least one etch channel.

16. The method as claimed in claim 11, wherein the step of sealing is performed in vacuum so that the sealed microcavity is a sealed vacuum microcavity and wherein the desired thickness of the metal diaphragm is sufficient to sustain one atmosphere of differential pressure thereacross.

17. The method as claimed in claim 11, wherein the substrate is a wafer.

18. The method as claimed in claim 11, further comprising forming at least one fluid feedthrough in communication with the sealed microcavity.

19. The method as claimed in claim 11, wherein the desired thickness is greater than approximately 20 microns.

20. The method as claimed in claim 11 wherein temperature does not exceed 250° C. during the entire method.

* * * * *